(12) United States Patent
Lee et al.

(10) Patent No.: US 8,581,294 B2
(45) Date of Patent: Nov. 12, 2013

(54) ORGANIC LIGHT EMITTING DIODE (OLED) DISPLAY

(75) Inventors: Jung-Min Lee, Yongin (KR); Tae-Wook Kang, Yongin (KR); Jang-Hwan Shin, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 127 days.

(21) Appl. No.: 13/067,034

(22) Filed: May 3, 2011

(65) Prior Publication Data

US 2012/0012890 A1 Jan. 19, 2012

(30) Foreign Application Priority Data

Jul. 14, 2010 (KR) .......................... 10-2010-0068077

(51) Int. Cl.
*H01L 33/00* (2010.01)
(52) U.S. Cl.
USPC .................................. 257/100; 257/E33.059
(58) Field of Classification Search
USPC .......................................... 257/100, E33.059
See application file for complete search history.

(56) References Cited

U.S. PATENT DOCUMENTS

| 7,977,879 B2 * | 7/2011 | Kwon ........................... 313/582 |
| 2007/0152222 A1 * | 7/2007 | Joo ................................. 257/72 |
| 2008/0111479 A1 | 5/2008 | Choi et al. |
| 2009/0009063 A1 | 1/2009 | Botelho et al. |
| 2011/0006972 A1 * | 1/2011 | Tanaka ............................. 345/76 |

FOREIGN PATENT DOCUMENTS

| KR | 10-2005-0025811 | 3/2005 |
| KR | 1020060077055 A | 7/2006 |
| KR | 10-0824531 | 4/2008 |

* cited by examiner

*Primary Examiner* — Timor Karimy
(74) *Attorney, Agent, or Firm* — Robert E. Bushnell, Esq.

(57) ABSTRACT

An organic light emitting diode (OLED) display device that includes: a first substrate having a first area and a second area adjacent to the first area; an organic light emitting diode (OLED) disposed on the first area of the first substrate; a second substrate facing the first substrate such that the OLED is interposed between the first substrate and the second substrate so as to expose the second area of the first substrate; and a sealant disposed between the first substrate and the second substrate to attach and seal the first substrate to the second substrate, wherein the sealant surrounds the OLED by a predetermined distance and having a first width of one portion closer to the second area that is larger than a second width of an other portion which is farther from the second area.

9 Claims, 10 Drawing Sheets
(2 of 10 Drawing Sheet(s) Filed in Color)

ORGANIC LIGHT EMITTING DIODE (OLED) DISPLAY

CLAIM OF PRIORITY

This application makes reference to, incorporates the same herein, and claims all benefits accruing under 35 U.S.C. §119 from an application earlier filed in the Korean Intellectual Property Office on the 14 Jul. 2010 and there duly assigned Serial No. 10-2010-0068077.

BACKGROUND OF THE INVENTION

1. Field of the Invention

The described technology relates generally to an organic light emitting diode display, and more particularly, to an organic light emitting diode display including frit as a sealant.

2. Description of the Related Art

An organic light emitting diode (OLED) display has attracted public attention as a display device displaying an image. The OLED display is a self emitting display device that does not require an additional light source to emit light. Since the OLED display does not need the additional light source, which is used in a liquid crystal display, it is possible to reduce a thickness and a weight of the OLED display. Furthermore, the OLED display shows high-quality characteristics including lower power consumption, high luminance, and high response speed.

In general, the OLED display includes a first substrate, an OLED positioned on the first substrate, a second substrate facing the first substrate with the OLED interposed therebetween, and a sealant such as frit which attaches and seals the first substrate and the second substrate to each other. However, in a case where at least one of the first substrate and the second substrate is made of a fragile material such as glass, and the like, when a physical impact, or in other words an impact force, is applied to the OLED display from the outside or an external source, at least one of the first substrate, the second substrate, and the frit may be damaged.

The above information disclosed in this Background section is only for enhancement of understanding of the background of the described technology and therefore it may contain information that does not form the prior art that is already known in this country to a person of ordinary skill in the art.

SUMMARY OF THE INVENTION

Aspects of the present invention provide an organic light emitting diode (OLED) display having advantages of an improved impact-resistance.

According to an aspect of the present invention, there is provided an organic light emitting diode display (OLED) that includes: a first substrate having a first area and a second area adjacent to the first area; an organic light emitting diode (OLED) disposed on the first area of the first substrate; a second substrate facing the first substrate such that the OLED is interposed between the first substrate and the second substrate so as to expose the second area of the first substrate; and a sealant disposed between the first substrate and the second substrate to attach and seal the first substrate to the second substrate, wherein the sealant surrounds the OLED by a predetermined distance, and wherein the sealant has a first width of one portion closer to the second area that is larger than a second width of an other portion which is farther from the second area.

According to another aspect of the present invention, the sealant may be formed of a frit material.

According to another aspect of the present invention, the first width of the one portion of the sealant may be 1.1 to 3 times larger than the second width of the other portion.

According to another aspect of the present invention, the first width of the one portion of the sealant may be 1.5 times larger than the second width of the other portion.

According to another aspect of the present invention, the second width of the other portion of the sealant may be 450 µm, and the first width of the one portion of the sealant may be in the range of 550 µm to 950 µm.

According to another aspect of the present invention, the other portion of the sealant may be bent and extended from the one portion, and the bent portion between the other portion and the one portion of the sealant may be curved.

According to aspects of the present invention, there is provided an organic light emitting diode display having improved impact-resistance.

Additional aspects and/or advantages of the invention will be set forth in part in the description which follows and, in part, will be obvious from the description, or may be learned by practice of the invention.

BRIEF DESCRIPTION OF THE DRAWINGS

The patent or application file contains at least one drawing executed in color. Copies of this patent or patent application publication with color drawing(s) will be provided by the Office upon request and payment of the necessary fee. Furthermore, These and/or other aspects and advantages of the invention will become apparent and more readily appreciated from the following description of the embodiments, taken in conjunction with the accompanying drawings of which.

DETAILED DESCRIPTION OF THE INVENTION

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Accordingly, the drawings and description are to be regarded as illustrative in nature and not restrictive. Like reference numerals designate like elements throughout the specification. In addition, the size and thickness of each component shown in the drawings are arbitrarily shown for understanding and ease of description, but the present invention is not limited thereto. In the drawings, the thickness of layers, films, panels, regions, etc., are exaggerated for clarity. In the drawings, for understanding and ease of description, the thicknesses of some layers and areas are exaggerated. It will be understood that when an element such as a layer, film, region, or substrate is referred to as being "on" another element, it can be directly on the other element or intervening elements may also be present. Further, in the specification, unless explicitly described to the contrary, the word "comprise" and variations such as "comprises" or "comprising", will be understood to imply the inclusion of stated elements but not the exclusion of any other elements. Further, throughout the specification, "on" implies being positioned above or below a target element and does not imply being necessarily positioned on the top on the basis of a gravity direction.

Furthermore, in the accompanying drawings, although an active matrix (AM) type OLED display having a 2Tr-1 Cap structure, which is provided with two thin film transistors (TFTs) and one storage capacitor in one pixel is shown, exemplary embodiments are not limited thereto. Accordingly, the OLED display may be provided with three or more thin film transistors and two or more storage capacitors in one pixel and may be configured to have various structures with additional wires. Herein, the pixel represents a minimum unit displaying an image and the OLED display displays the image by means of a plurality of pixels.

Figure 1:
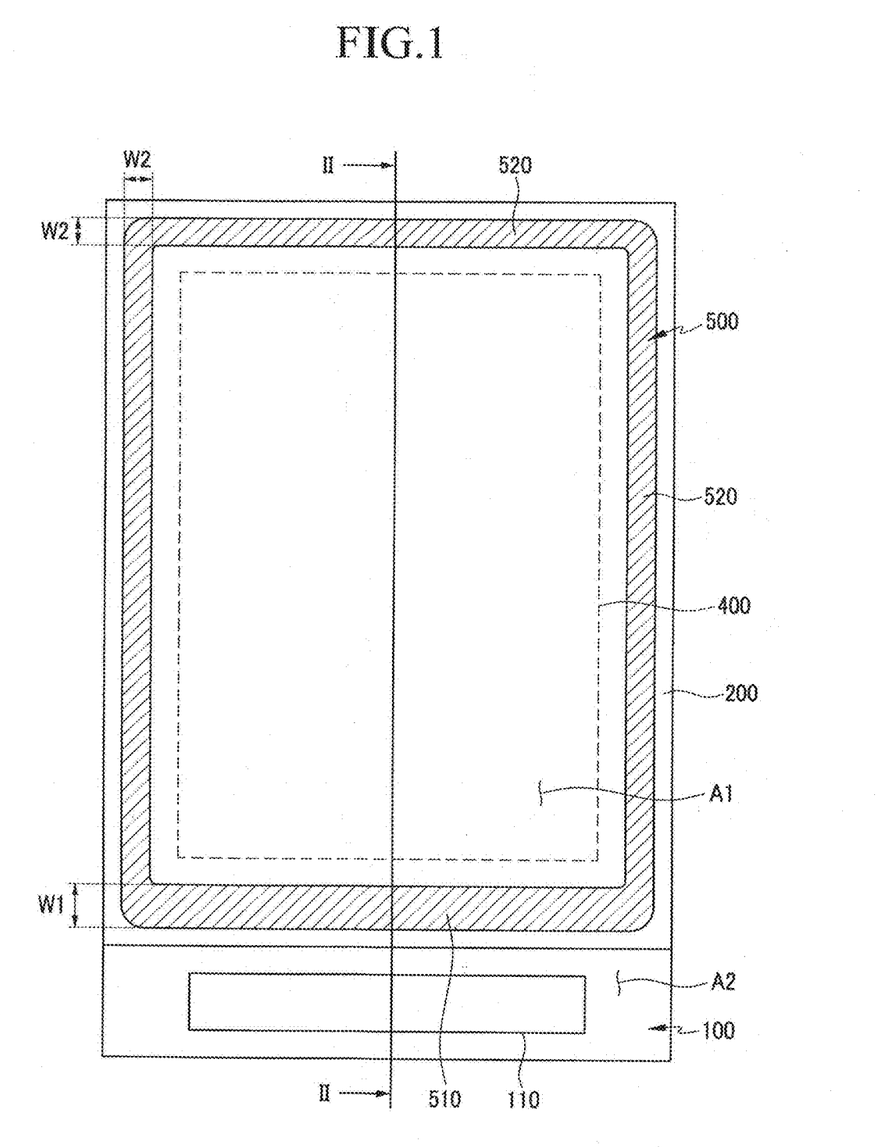
FIG. 1 is a plan view of an organic light emitting diode (OLED) display according to an exemplary embodiment.
Figure 2:
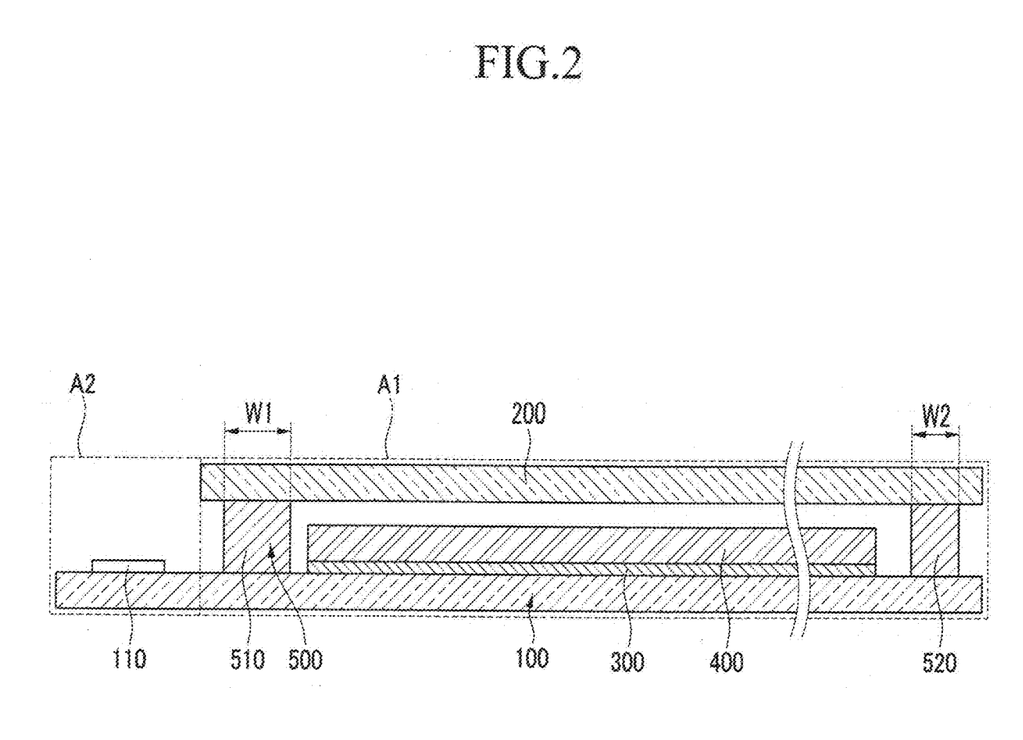
FIG. 2 is a cross-sectional view taken along line II-II of FIG. 1.

Hereinafter, referring to FIGS. 1 to 5, an organic light emitting diode (OLED) display, according to an exemplary embodiment, will be described. FIG. 1 is a plan view of an OLED display according to an exemplary embodiment. FIG. 2 is a cross-sectional view taken along line II-II of FIG. 1. As shown in FIGS. 1 and 2, the OLED display includes a first substrate 100, a second substrate 200, a wire part 300, an organic light emitting diode (OLED) 400, and a sealant 500.

The first substrate 100 and the second substrate 200 are insulating substrates and may be formed of glass, polymer, stainless steel, or other similar materials. At least one of the first substrate 100 and the second substrate 200 is made of a light transmissive material. The wire part 300 and the OLED 400 are disposed on the first substrate 100. The second substrate 200 faces the first substrate 100. The wire part 300 and the OLED 400 are interposed between the first substrate 100 and the second substrate 200. The first substrate 100 and the second substrate 200 are attached and sealed to each other by the sealant 500 with the OLED 400 interposed therebetween. The first substrate 100 and the second substrate 200 protect the wire part 300 and the OLED 400 from external interference.

Furthermore, the first substrate 100 includes a first area A1 and a second area A2 adjacent to the first area A1. The first area A1 is between the first substrate 100 and the second substrate 200 and is covered in part by with the sealant 500. The OLED 400 is positioned in the part of the first area A1 that is covered by the sealant 500.

The second area A2 is adjacent to the first area A1 and is positioned on an end of the second substrate 200 so as to be exposed to an outside. That is, the second substrate 200 faces the first substrate 100 with the OLED 400 interposed between the first substrate 100 and the second substrate 200 so as to expose the second area A2. A driving unit 110, on which a circuit chip and the like is mounted, is disposed in the second area A2. The driving unit 110 drives the OLED 400 by transferring a signal to the wire part 300.

The wire part 300 includes first and second thin film transistors 10 and 20 (shown in FIG. 3) and drives the OLED 400 by transferring a signal to the OLED 400. The OLED 400 emits light depending on the signal received from the wiring part 300. The OLED 400 is disposed on the wire part 300. The OLED 400 is disposed on the first substrate 100 in the first area A1 and receives the signal from the wire part 300 in order to display an image by using the received signal.

Figure 3:
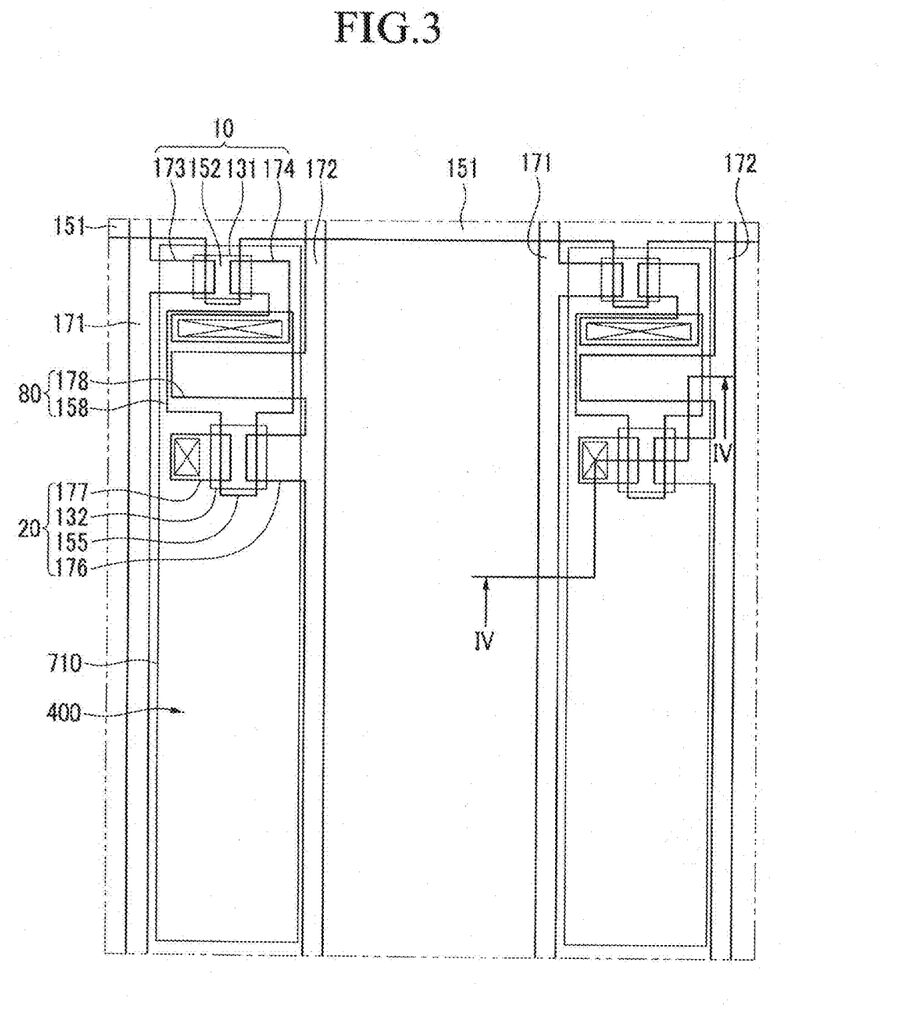
FIG. 3 is a layout view illustrating the structure of a pixel of an organic light emitting diode (OLED) display according to an exemplary embodiment.
Figure 4:
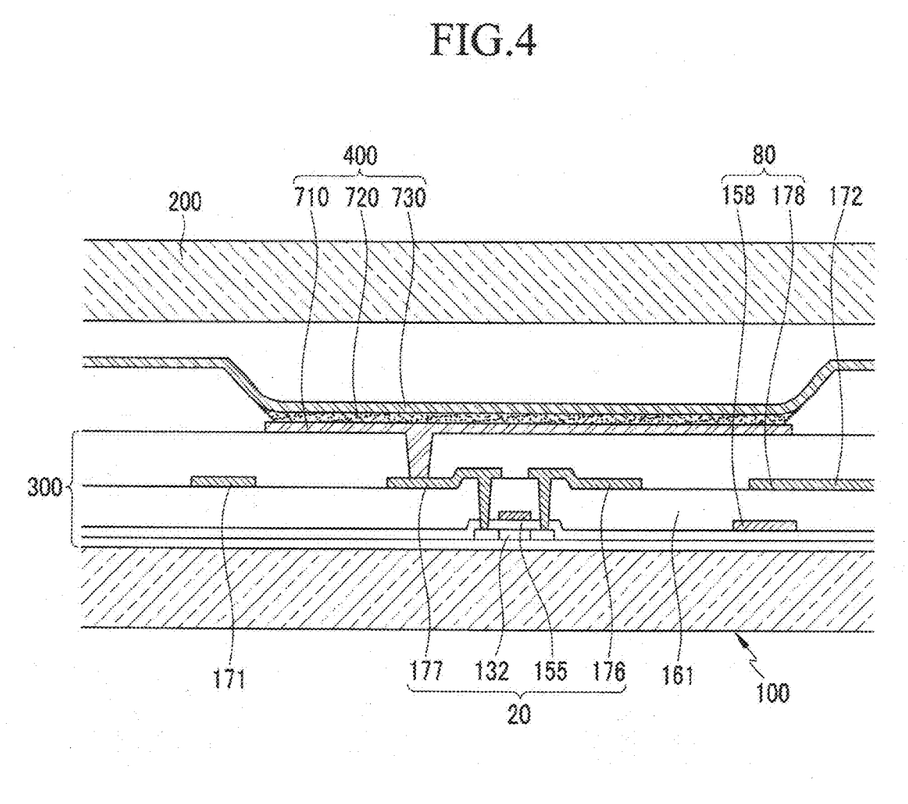
FIG. 4 is a cross-sectional view taken along line IV-IV of FIG. 3.

Hereinafter, referring to FIGS. 3 and 4, an internal structure of the OLED display according to the embodiment of FIG. 1 will be described in detail. FIG. 3 is a layout view illustrating a structure of a pixel of an organic light emitting diode (OLED) display according to an exemplary embodiment. FIG. 4 is a cross-sectional view taken along line IV-IV of FIG. 3.

The detailed structures of the wire part 300 and the OLED 400 are shown in FIGS. 3 and 4, however, aspects of the present invention are not limited to the structures shown in FIGS. 3 and 4. The wire part 300 and the OLED 400 may be formed in various structures within the scope which can be easily modified by one of ordinary skill in the art. For example, although the OLED display is illustrated as an active matrix (AM) type OLED display having a 2Tr-1Cap structure, which is provided with two thin film transistors (TFTs) and one storage capacitor in one pixel, aspects of the present invention are not limited thereto. Therefore, the OLED display may vary with respect to a number of thin film transistors, a number of storage capacitors, and a number of wires. Additionally, a pixel represents a minimum unit displaying an image and the OLED display displays the image through the pixels.

As shown in FIGS. 3 and 4, the OLED display includes a switching thin film transistor 10, a driving thin film transistor 20, a storage capacitor 80, and an organic light emitting diode (OLED) 400 formed in each pixel. In the present embodiment, the wire part 300 includes the switching thin film transistor 10, the driving thin film transistor 20, and the storage capacitor 80. In addition, the wire part 300 further includes a gate line 151 disposed in one direction of the first substrate 100, and a data line 171 and a common power supply line 172 crossing and insulated from the gate line 151. Although a boundary of one pixel may be defined by the gate line 151, the data line 171, and the common power supply line 172, aspects of the present invention are not limited thereto.

The OLED 400 includes a first electrode 710, an organic emission layer 720 formed on the first electrode 710, and a second electrode 730 formed on the organic emission layer 720. The first electrode 710, the organic emission layer 720, and the second electrode 730 constitute the OLED 400. In the present embodiment, the first electrode 710 is an anode which is a hole injection electrode and the second electrode 730 is a cathode which is an electron injection electrode. However, aspects of the present invention are not limited thereto, and the first electrode 710 may be the cathode and the second electrode 730 may be the anode according to a driving method of the OLED display. Holes and electrons are injected into the organic light emitting layer 720 from the first electrode 710 and the second electrode 730, respectively. When excitons generated by combining the injected holes and the injected electrons fall from an excited state to a ground state, the organic emission layer 720 emits light. Furthermore, at least one of the first electrode 710 and the second electrode 730 is made of a transparent or translucent conductive material such as indium tin oxide (ITO) and indium zinc oxide (IZO).

In the OLED display according to the present exemplary embodiment, the OLED 400 emits light toward at least one of the first substrate 100 and the second substrate 200. That is, according to aspects of the present invention, the OLED display may be a top emission type, a bottom emission type, or a double-sided emission type.

The storage capacitor 80 includes a pair of storage plates 158 and 178 and an interlayer insulating layer 161 is interposed between the storage plates 158 and 178. An interlayer insulating layer 161 becomes a dielectric and a storage capacity of the storage capacitor 80 is determined by electric charges stored in the storage capacitor 80 and voltage between the storage plates 158 and 178.

The switching thin film transistor 10 includes a switching semiconductor layer 131, a switching gate electrode 152, a switching source electrode 173, and a switching drain electrode 174. The driving thin film transistor 20 includes a driving semiconductor layer 132, a driving gate electrode 155, a driving source electrode 176, and a driving drain electrode 177. The switching thin film transistor 10 is used as a switching element that selects a desired pixel to emit light. The switching gate electrode 152 is connected to the gate line 151. The switching source electrode 173 is connected to the data line 171. The switching drain electrode 174 is disposed away from the switching source electrode 173 and is connected to any one storage plate 158.

The driving thin film transistor 20 applies driving power to the first electrode 710 so that the organic emission layer 720 in a selected pixel emits light. The driving gate electrode 155 is connected to the storage plate 158 which is connected with the switching drain electrode 174. Each of the driving source electrode 176 and the other storage plate 178 is connected to a common power supply line 172. The driving drain electrode 177 is connected to the first electrode 710 of the OLED 400 through a contact hole (not shown).

In the structure of the present embodiment, the switching thin film transistor 10 is operated by a gate voltage applied to the gate line 151 in order to transmit data voltage applied to the data line 171 to the driving thin film transistor 20. A voltage equivalent to a difference between a common voltage applied to the driving thin film transistor 20 from the common power supply line 172 and the data voltage transmitted from the switching thin film transistor 10 is stored in the storage capacitor 80. Also, a current corresponding to a voltage stored in the storage capacitor 80 flows to the OLED 400 through the driving thin film transistor 20 to allow the OLED 400 to emit light.

Referring back to FIGS. 1 and 2, the sealant 500 is positioned between the first substrate 100 and the second substrate 200 and surrounds the OLED 400 at predetermined intervals. The sealant 500 is disposed on edges of the first substrate 100 and the second substrate 200 to attach and seal the first substrate 100 and the second substrate 200 to each other. The sealant 500 includes a frit material. The frit material is cured by a curing member such as a laser or other similar devices and processes. The sealant 500 includes a first part 510 and a second part 520. The first part 510 is closer to the second area A2 than the second part 520 and the second part 520 of the sealant 500 is bent and extended from the first part 510. A bent part between the first part 510 and the second part 520 of the sealant 500 has a curved shape.

The bent part between the first part 510 and the second part 520 of the sealant 500 has the curved shape, consequently, when an impact is applied to the OLED display, a maximum principal stress applied to the first part 510 of the sealant 500 is easily transitioned to the second part 520. As a result, the maximum principal stress applied to the first part 510 of the sealant 500 decreases.

A first width W1 of the first part 510 is larger than a second width W2 of the second part 520. The first width W1 of the first part 510 is 1.1 to 3 times larger than the second width W2 of the second part 520 and, for example, may be 1.5 times larger than the second width W2 of the second part 520. Furthermore, when the second width W2 of the second part 520 of the sealant 500 is 450 um, the first width W1 of the first part 510 of the sealant 500 may be in the range of 550 µm to 950 µm. However, it is understood that values of the first width W1 of the first part 510 and the second width W2 of the second part 520 of the sealant 500 can be other values in other aspects. As such, the first width W1 of the first part 510 is larger than the second width W2 of the second part 520, such that the impact-resistance of an OLED display can be improved and a slim OLED display can be implemented.

Hereinafter, referring to FIGS. 5 to 10, in the OLED display according to the present exemplary embodiment, the reason why the first width W1 of the first part 510 of the sealant 500 is larger than the second width W2 of the second part 520 of the sealant 500 according to aspects of the present invention will be described in detail.

First, a frit material is used as a sealant 500 to provide a high-temperature melting adhesive using glass powder as a main raw material. However, the frit material is fragile. Therefore, the OLED display has a decreased mechanical strength (or in other words, a decreased structural strength) and, thus, is more vulnerable than a liquid crystal display in which both substrates are attached to each other by a sealant such as epoxy or another flexible material. In particular, when the OLED display drops from a height the structural strength of the OLED display is most vulnerable.

When a broken part of the dropped OLED display is observed, a probability that a breakage source is the frit material of the sealant 500 is 80% or more. In order to improve the structural strength of the OLED display by suppressing damage to the sealant 500, an overall width of the sealant 500 may be increased. However, it is not preferable to increase an overall width of the sealant 500 when attempting to maximize a space occupied by an effective pixel where the OLED is positioned in the OLED display. In other words, a size and a thickness of the OLED display may increase when increasing an overall width of the sealant 500. Thus, the following experiment is performed in order to provide an OLED display with improved impact-resistance and a slim thickness.

FIGS. 5 to 9 are diagrams for describing a test in which an organic light emitting diode (OLED) display is provided according to an exemplary embodiment. FIG. 10 is a graph describing a test in which an organic light emitting diode (OLED) display is provided according to the exemplary embodiment of FIGS. 5 to 9.

Figure 5:
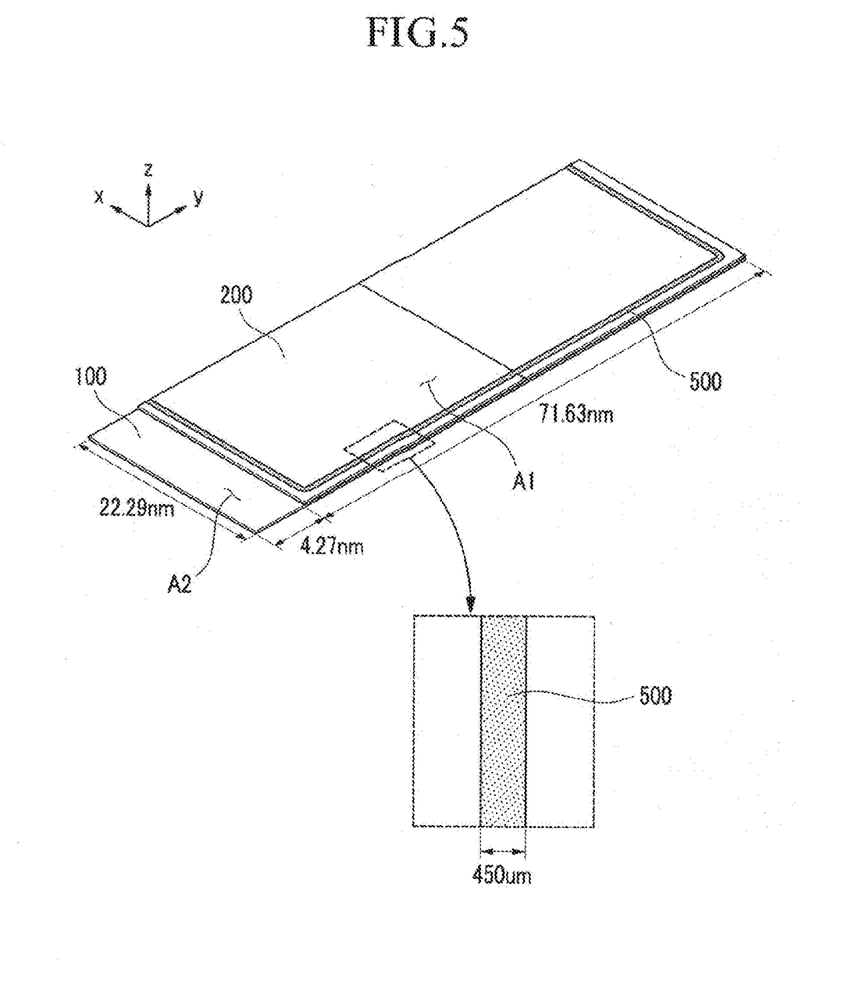
FIGS. 5 to 9 are diagrams describing an experiment in which an organic light emitting diode (OLED) display is deduced according to an exemplary embodiment.

First, a 3.1 inch cubic panel, which is an organic light emitting diode (OLED) display having a size shown in FIG. 5, is provided. In this panel, a width of the sealant 500 is set as 450 µm. The sealant 500 is glass frit attaching the first substrate 100 and the second substrate 200, which are made of glass, to each other. Hereinafter, the OLED display will be referred to as the panel and the sealant 500 will be referred to as the glass frit.

Figure 6:
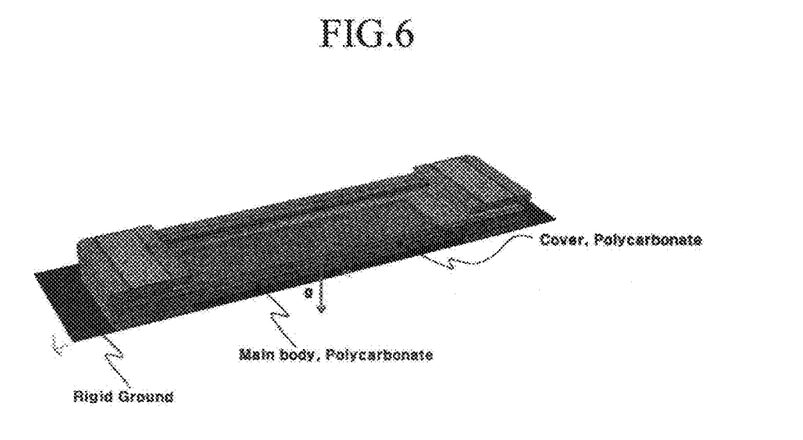

When a drop test is performed on such a panel, the panel is inserted into a drop jig simulating a mobile device such as a cellular phone, as shown in FIG. 6. The panel drops from a predetermined height to a bottom without just throwing the panel to the bottom. In the present test, the weight of the drop jig is approximately 73 g and a panel having a weight of 8.26 g is added thereto. In the drop test, the panel and the drop jig drops to an iron-plate bottom disposed at 1.5 m or more below an initial start point of the dropping of the panel and the drop jig.

Figure 7:
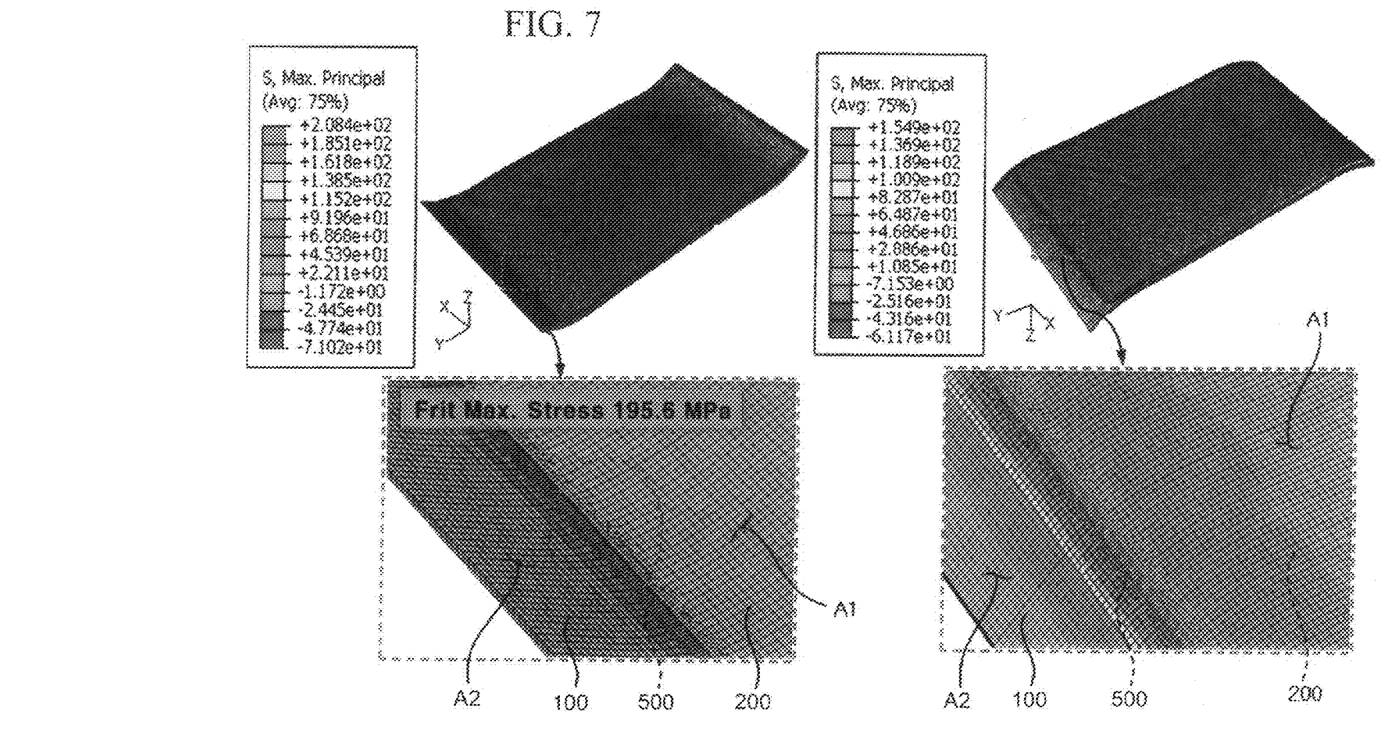
Figure 8:
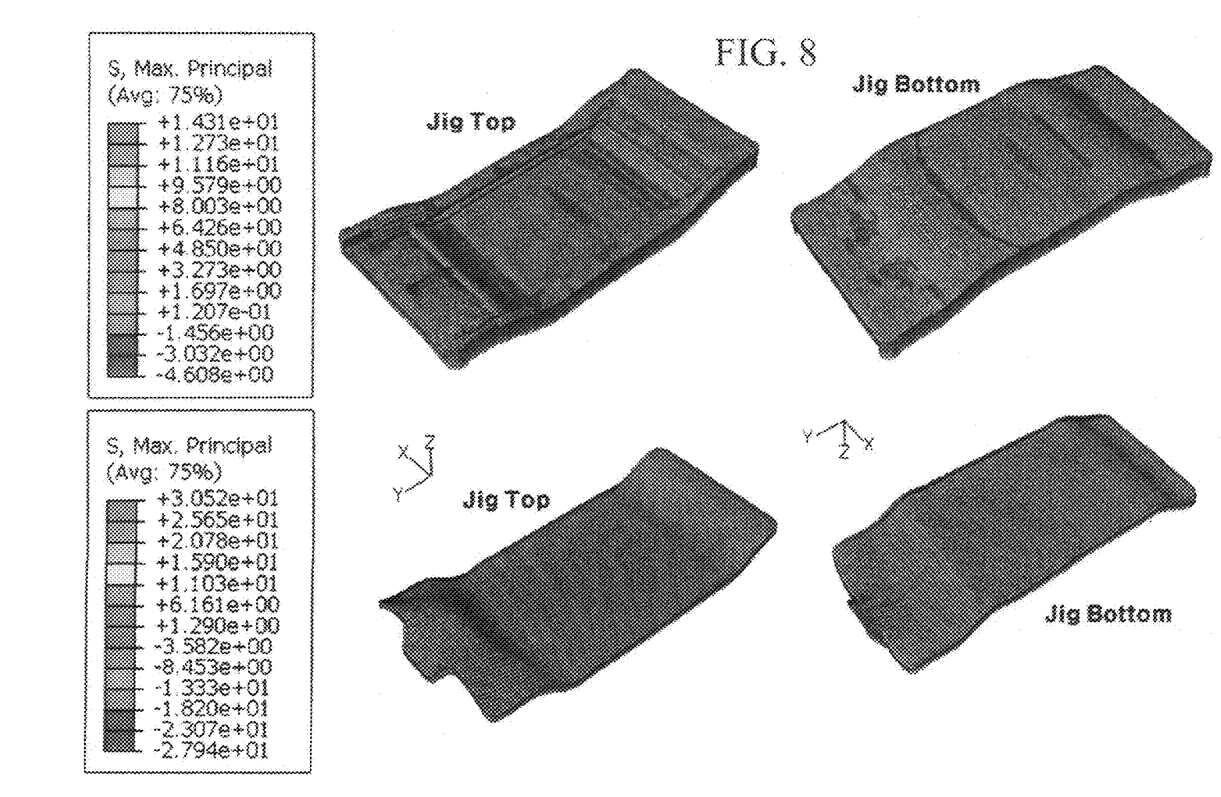

When this drop test is simulated by using ABAQUS, which is a structure, electricity, and heat analysis tool sold by SIMULIA of Dassault Systems, the glass frit around the second area A2 of the first substrate 100 is damaged as shown in FIG. 7. More specifically, a portion of the end of the glass frit where the glass frit and the first substrate 100 contact each other, which is adjacent to the OLED is damaged. The portion where the glass frit and the first substrate contact each other is the maximum stress point of the glass frit shown in FIG. 7. In regards to the cause of the damage, the glass frit is damaged not by an impact generated when the panel first collides with the bottom. Rather, the glass frit is damaged by a transforming of the panel while the drop jig is bent in a W shape, as shown in FIG. 8, which happens at a time of tens of microseconds after the panel collides with the bottom.

When such a case as described above is determined on the basis of a simple beam theory, the second area A2 of the first substrate 100 is larger than the second substrate 200, such that the second area A2 protrudes outwardly from an end of the second substrate 200. Therefore, when viewed from the panel attached by the glass frit, a thickness of only the second area A2 of the first substrate 100 may be regarded to be decreased. Therefore, when a bending moment, which is external force, is applied to the panel, an area having the smaller thickness is further bent and a larger stress is generated at this area. However, the glass fit is damaged because the ultimate strength of the glass frit is lower than that of the glass forming the first substrate 100 and the second substrate 200. On the basis of the above noted causes, the following improvement measures are considered, including decreasing the maximum principal stress generated in the glass frit adjacent to the second area A2 of the first substrate 100.

Figure 9:
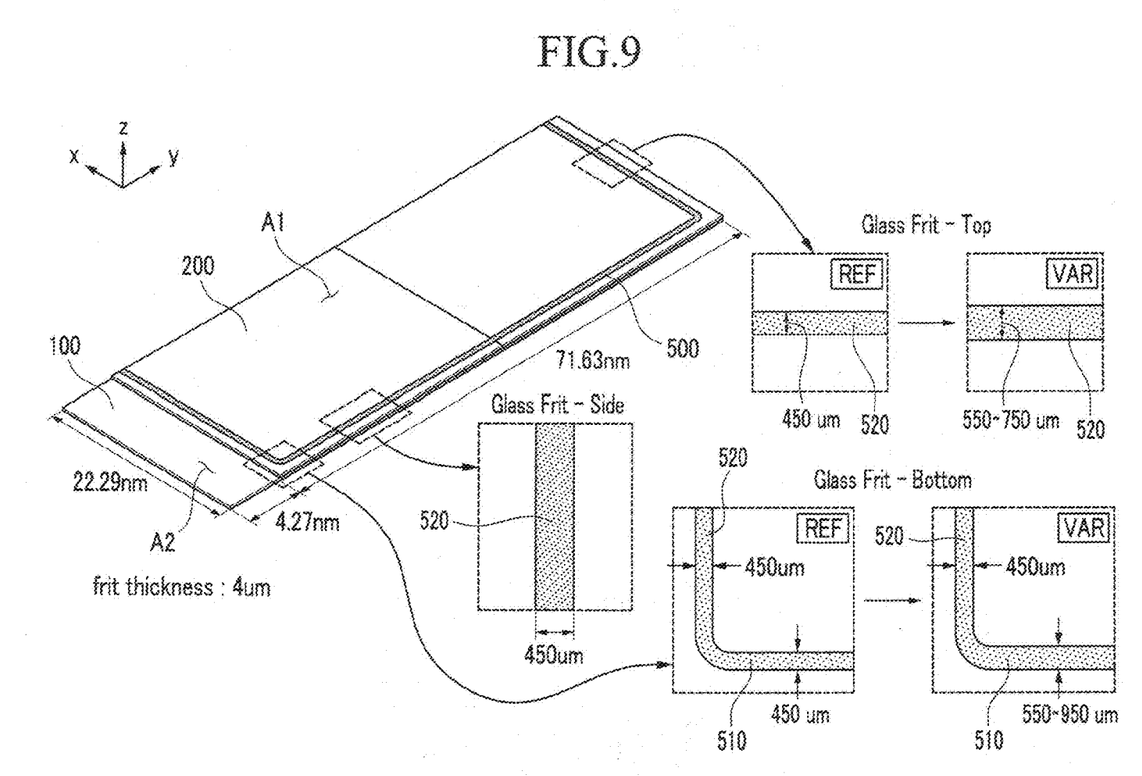
Figure 10:
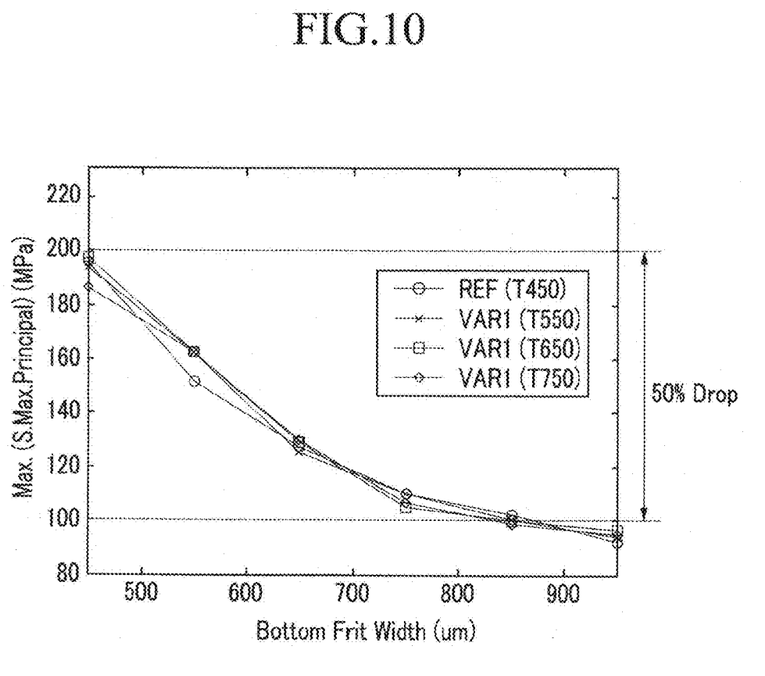
FIG. 10 is a graph describing an experiment in which an organic light emitting diode (OLED) display is provided according to an exemplary embodiment.

In order to achieve the improvement measures, a width of the glass frit corresponding to a short side of the panel is increased, as shown in FIG. 9. At this time, the thickness of the glass frit is 4 μm. As shown in FIG. 9, two short-side glass frits are provided in the panel. When a width of the top short-side glass frit (shown as glass frit-top in FIG. 9) increases, panel adhesion strength increases as the adhesion area of the glass frit increases. However, the maximum principal stress generated in the panel cannot be reduced by the transformation of the glass frit generated while the part corresponding to the second area A2 of the first substrate 100 is bent when the panel is transformed by dropping. Accordingly, in order to increase the width of the glass frit, a width of the bottom glass frit (shown as glass frit-bottom in FIG. 9), which is close to the second area A2 of the first substrate 100, should be increased.

Results acquired at the time of increasing the width of the upper short-side glass frit and the width of the bottom short-side glass frit are verified through simulation and are shown in a graph of FIG. 10. In the graph shown in FIG. 10, an x axis represents the width of the bottom short-side glass frit [bottom frit width (μm)] and a y axis represents the maximum principal stress [Max. (S.Max.Principal) (MPa)] applied to the bottom short-side glass frit.

As shown in FIG. 10, the width of the top short-side glass frit is set as 450 μm to 750 μm [REF(T450), VAR1(T550), VAR1(650), VART(750)], the width of the bottom short-side glass frit is set as 450 μm to 950 μm, and a width of a long-side glass frit at the side (shown as glass frit-side in FIG. 9) is set as 450 μm. In such a case, when a width of the bottom short-side glass frit is approximately twice as large as the width of the long-side glass frit at the side, regardless of the size of the width of the top short-side glass frit, the maximum principal stress applied to the bottom short-side glass frit is decreased by approximately 50% as compared to when the bottom short-side glass frit has a witch of 450 μm. Meanwhile, the change in the width of the top short-side glass frit does not cause the maximum principal stress applied to the bottom short-side glass frit from being reduced.

That is, when the first width W1 and the second width W2 are varied as described above, the maximum principal stress applied to the first part 510 of the sealant 500 is reduced. The first width W1 and the second width W2 may be varied in the following manner. The first width W1 of the first part 510 is set to be 1.1 to 3 times larger than the second width W2 of the second part 520. Also, the width of the side long-side glass frit or the first width W1 of the first part 510 is in the range of 550 μm to 950 μm while the second width W2 of the second part 520 is 450 μm. However, aspects of the present invention are not limited to the above widths of the first width W1 and the second width W2, and other suitable widths of the first width W1 and the second width W2 may be used.

In the OLED display according to the present exemplary embodiment, the maximum principal stress applied to the first part 510 of the sealant 500 is reduced when the impact is applied to the OLED display. Thus, an impact-resistance of the OLED display is improved. In particular, since only the first width W1 of the first part 510 of the sealant 500 is larger than the second width W2 of the second part 520, the impact-resistance of the OLED display is improved and a slim OLED display may be obtained.

Furthermore, in the OLED display according to the present exemplary embodiment, the bent part between the first part 510 and the second part 520 of the sealant 500 has the curved shape. Thus, when an impact is applied to the OLED display, the maximum principal stress applied to the first part 510 of the sealant 500 is easily transitioned to the second part 520. As a result, the maximum principal stress applied to the first part 510 of the sealant 500 decreases, thereby improving the impact resistance of the OLED display. While described in terms of a sealant made of a frit material, it is understood that aspects of the invention could be used with other fragile and/or non-fragile sealant materials.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. An organic light emitting diode (OLED) display, comprising:
    a first substrate having a first area and a second area adjacent to the first area, said second area containing a driving unit attached to the first substrate to drive the OLED display;
    an organic light emitting diode (OLED) disposed on the first area of the first substrate;
    a second substrate facing the first substrate such that the OLED is interposed between the first substrate and the second substrate so as to expose the second area of the first substrate; and
    a sealant disposed between the first substrate and the second substrate to attach and seal the first substrate to the second substrate, said
    sealant includes four sides that surround the OLED by a predetermined distance with solely one of the four sides immediately adjacent to the second area containing the driving unit, and
    wherein said solely one of the four sides immediately adjacent to the second area containing the driving unit of the sealant has a first width that is larger than a second width of the other three sides of the sealant, said second width being equal for each of the other three sides of the sealant, and
    wherein the first width of the sealant is 1.1 to 3 times larger than the second width of the sealant.

2. The organic light emitting diode display of claim 1, wherein the sealant is formed of a frit material.

3. The organic light emitting diode display of claim 2, wherein the second width of the sealant is 450 μm, and the first width of the sealant is in the range of 550 μm to 950 μm.

4. The organic light emitting diode display of claim 3, where the four sides of the sealant meet a curved shape exists.

5. The organic light emitting diode display of claim 2, wherein where the four sides of the sealant meet a curved shape exists.

6. The organic light emitting diode display of claim 1, wherein the first width of the sealant is 1.5 times larger than the second width of the sealant.

7. The organic light emitting diode display of claim 6, wherein where the four sides of the sealant meet a curved shape exists.

8. The organic light emitting diode display of claim 1, wherein where the four sides of the sealant meet a curved shape exists.

9. The organic light emitting diode display of claim 1, wherein where the four sides of the sealant meet a curved shape exists.

* * * * *